(12) United States Patent
Matsushita

(10) Patent No.: US 8,653,879 B2
(45) Date of Patent: Feb. 18, 2014

(54) LEVEL SHIFTER AND SEMICONDUCTOR INTEGRATED CIRCUIT INCLUDING THE SHIFTER

(71) Applicant: Panasonic Corporation, Osaka (JP)

(72) Inventor: Tsuyoshi Matsushita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/685,052

(22) Filed: Nov. 26, 2012

(65) Prior Publication Data

US 2013/0082759 A1   Apr. 4, 2013

Related U.S. Application Data

(63) Continuation of application No. PCT/JP2010/007111, filed on Dec. 7, 2010.

(30) Foreign Application Priority Data

May 24, 2010 (JP) .................................. 2010-118579

(51) Int. Cl.
*H03L 5/00* (2006.01)
(52) U.S. Cl.
USPC .......................................................... 327/333
(58) Field of Classification Search
USPC .......................................................... 327/333
See application file for complete search history.

(56) References Cited

U.S. PATENT DOCUMENTS

| 2003/0001616 A1 | 1/2003 | Fujikawa et al. |
| 2004/0000929 A1 | 1/2004 | Aoki |
| 2009/0302924 A1* | 12/2009 | Kim ............................. 327/333 |

FOREIGN PATENT DOCUMENTS

| JP | 63-164526 A | 7/1988 |
| JP | 2003-110419 A | 4/2003 |
| JP | 2004-040262 A | 2/2004 |
| JP | 2006-237760 A | 9/2006 |

OTHER PUBLICATIONS

International Search Report mailed Feb. 15, 2011 issued in corresponding International Application No. PCT/JP2010/007111.

* cited by examiner

*Primary Examiner* — John Poos
(74) *Attorney, Agent, or Firm* — McDermott Will & Emery LLP

(57) ABSTRACT

A level shifter for converting an input pulse signal of low-voltage amplitude to high-voltage amplitude includes a low voltage circuit configured to generate complementary-pulse signals of low-voltage amplitude from the input pulse signal, and a high voltage circuit configured to generate a pulse signal of high-voltage amplitude based on the complementary-pulse signals. The low voltage circuit, including high-threshold voltage transistors, includes a plurality of inverter circuits connected in cascade and at least one resistive-switch circuit connected between an input and an output of at least one of the plurality of inverter circuits configured to operate as a resistor when in a conductive state.

20 Claims, 4 Drawing Sheets

LEVEL SHIFTER AND SEMICONDUCTOR INTEGRATED CIRCUIT INCLUDING THE SHIFTER

CROSS-REFERENCE TO RELATED APPLICATION

This is a continuation of PCT International Application PCT/JP 2010/007111 filed on Dec. 7, 2010, which claims priority to Japanese Patent Application No. 2010-118579 filed on May 24, 2010. The disclosures of these applications including the specifications, the drawings, and the claims are hereby incorporated by reference in their entirety.

BACKGROUND

The present disclosure relates to level shifters mounted in semiconductor integrated circuits having different power supply voltages, and more particularly to level shifters suitable for semiconductor integrated circuits including transistors having different breakdown voltages and threshold voltages, and manufactured in a miniaturized process.

In recent years, analog circuits and digital circuits have been mixed in a single semiconductor integrated circuit. Moreover, semiconductor integrated circuits have equipped with more and more functions. In a semiconductor integrated circuit, while an interface including numbers of analog circuits has had a power supply voltage (I/O voltage) of about 2.5 V or 3.3 V, a power supply voltage (core voltage) of a digital circuit has decreased to about 1.1 V. That is, recent semiconductor integrated circuits have generally had different power supply voltages. This requires a level shifter for converting a signal of low voltage amplitude, which is output from a core operating at a low voltage, to a high voltage amplitude, and transmitting the signal to a circuit operating at a high voltage.

There is a conventional level shifter logically inverts an input pulse signal of low voltage amplitude using an inverter circuit operating at a low voltage, and shifts the level of complementary pulse signals of low voltage amplitude, which include an input signal and an output signal of the inverter circuit, using two level shifters performing opposite operation. This enables high-speed operation with low power consumption (see, for example, Japanese Patent Publication No. 2004-40262). Another conventional level shifter does not include any inverter circuit which performs low-voltage operation for logically inverting an input pulse signal of low voltage amplitude. A DC component of the input pulse signal of low voltage amplitude is eliminated, and the signal is biased by an inverter circuit, which perform high-voltage operation and includes an input and an output, which are short-circuited. Then, the signal is input to gates of a Pch transistor and an Nch transistor forming the inverter circuit operating at a high voltage. (See, for example, Japanese Patent Publication No. 2003-110419).

In a miniaturized manufacturing process of 45 nm process or later generation, a circuit, which includes transistors having a low breakdown voltage and a low threshold voltage ranging from about 0.3 to about 0.4 V out of transistors operating at a low voltage, is under the following layout constraint. Channel directions of the transistors, i.e., directions of drains, gates, and sources need to be the same in order to prevent degradation in the characteristics of the transistors. For example, in the level shifter of Japanese Patent Publication No. 2004-40262, the inverter circuit, which logically inverts the input pulse signal of low voltage amplitude, includes transistors having a low breakdown voltage and a low threshold voltage similar to the transistors used in a digital circuit. Thus, the inverter circuit is under the layout constraint in a miniaturized manufacturing process. Assume that the level shifter has a rectangular circuit pattern. Even if a semiconductor integrated circuit has a vacant region in which the circuit pattern can be positioned after being rotated by 90°, the positioning cannot be made and the vacant region of the semiconductor integrated circuit cannot be efficiently used.

On the other hand, even if the inverter circuit includes high threshold voltage transistors free from the layout constraint instead of the low threshold voltage transistors, the level shifter does not accurately operate. It is thus necessary to prepare another circuit pattern of the level shifter, in which the channel directions of the low threshold voltage transistors are rotated by 90° to utilize a vacant region of a semiconductor integrated circuit efficiently. This increases, however, the number of designing steps.

Low-threshold voltage transistors have problems such as relatively large leakage currents, and aging degradation in the characteristics caused by kickback from a high voltage power supply. In particular, the level shifter operates at high speed and with low power consumption by employing the creative configuration of the high voltage circuits, and thus the degradation in the characteristics of the low voltage circuits directly influences the high-speed operation of the level shifter.

In this respect, for example, the level shifter of Japanese Patent Publication No. 2003-110419 does not include any low threshold voltage transistor, and thus the problems such as the layout constraint, leakage currents, and aging degradation in the characteristics are less likely to occur. However, the level shifter requires a capacitive element to eliminate the DC component of the input pulse signal of the low voltage amplitude, thereby increasing the circuit scale. Also, since the input and output of the inverter circuit operating at a high voltage are short-circuited to generate a bias voltage, through currents always flow to the inverter circuit, thereby increasing the current consumption.

Therefore, there is a need for a level shifter, which is freely positioned in a miniaturized manufacturing process with a small circuit scale, low power consumption, and less aging degradation.

SUMMARY

For example, a level shifter is for converting an input pulse signal of low voltage amplitude to high voltage amplitude. The level shifter includes a low voltage circuit configured to generate complementary pulse signals of low voltage amplitude from the input pulse signal; and a high voltage circuit configured to generate a pulse signal of high voltage amplitude based on the complementary pulse signals. The low voltage circuit includes a plurality of inverter circuits connected in cascade, each including a high threshold voltage transistor, and at least one resistive switch circuit connected between an input and an output of at least one of the plurality of inverter circuits, and configured to operate as a resistor when in a conductive state.

With this configuration, at least one of the inverter circuits in the low voltage circuit serves as an amplifier circuit by turning on the resistive switch circuit, and amplifies the input pulse signal of the low voltage amplitude to the threshold voltages of inverter circuits each of which includes a high threshold voltage transistor. Thus, even if each of the inverter circuits in the low voltage circuit includes a high threshold voltage transistor, the level shifter converts the input pulse signal of low voltage amplitude to high voltage amplitude.

The at least one resistive switch circuit may include two or more resistive switch circuits, each being independently controlled.

BRIEF DESCRIPTION OF THE DRAWINGS

The figures depict one or more implementations in accord with the present teachings, by way of example only, not by way of limitations. In the figures, like reference numerals refer to the same or similar elements.

DETAILED DESCRIPTION

Embodiments are described in detail below with reference to the attached drawings. However, unnecessarily detailed description may be omitted. For example, detailed description of well-known techniques or description of the substantially same elements may be omitted. Such omission is intended to prevent the following description from being unnecessarily redundant and to help those skilled in the art easily understand it.

Inventor provides the following description and the attached drawings to enable those skilled in the art to understand fully the present disclosure. Thus, the description and the drawings are not intended to limit the scope of the subject matter defined in the claims.

First Embodiment

Figure 1:
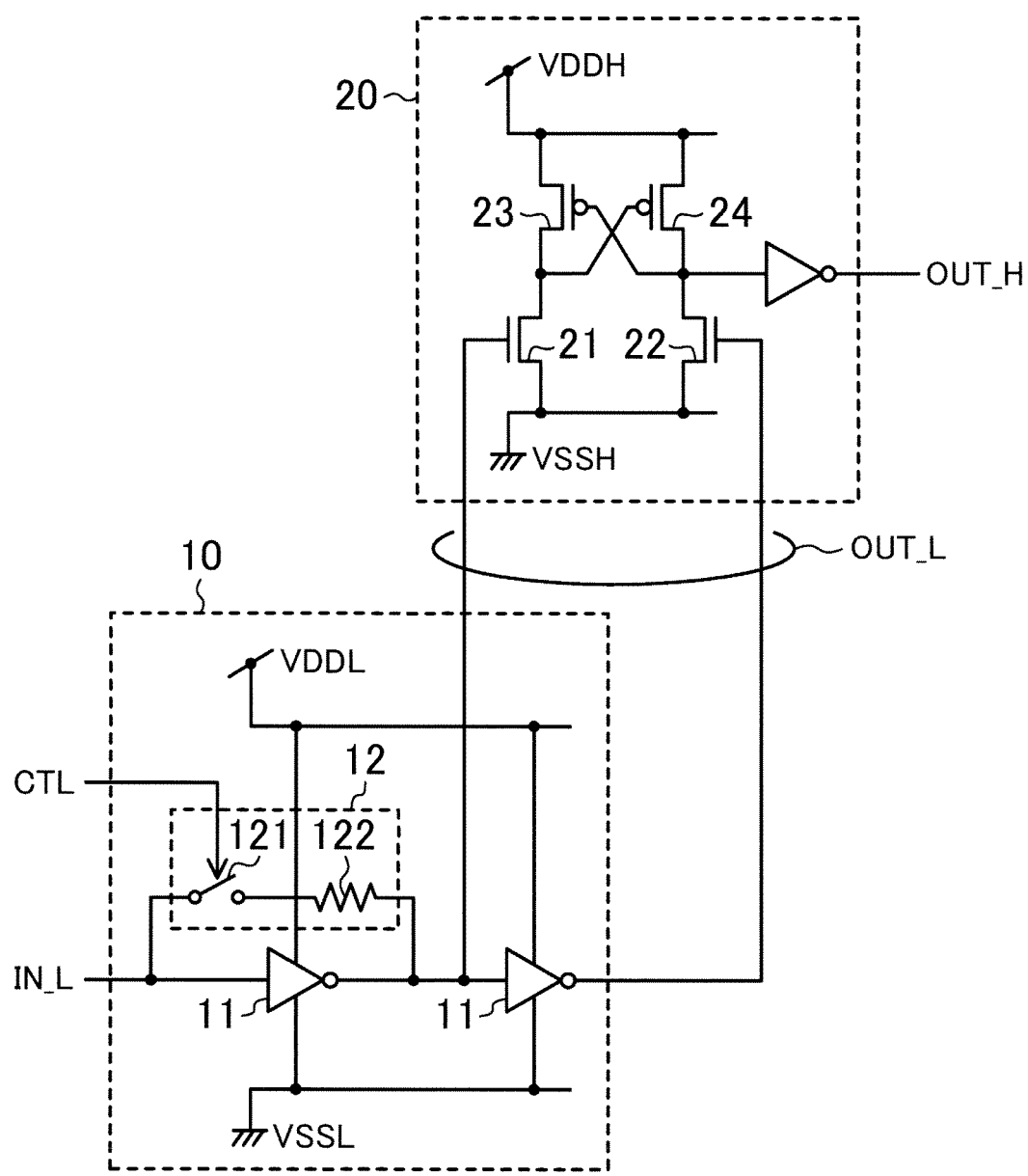
FIG. 1 is a circuit diagram of a level shifter according to a first embodiment.

FIG. 1 illustrates a circuit configuration of a level shifter according to a first embodiment. The level shifter according to this embodiment includes a low voltage circuit 10 and a high voltage circuit 20. The low voltage circuit 10 generates complementary pulse signals OUT_L of low voltage amplitude from an input pulse signal IN_L of low voltage amplitude. The high voltage circuit 20 generates a pulse signal OUT_H of high voltage amplitude based on the signals OUT_L.

Figure 2:
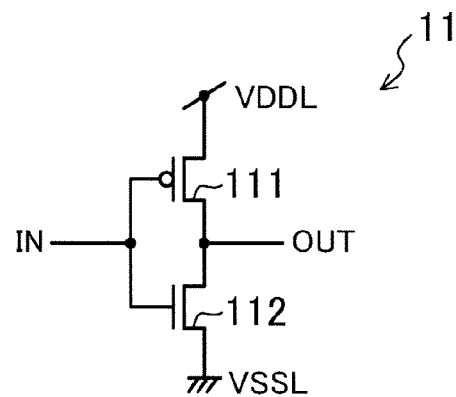
FIG. 2 is a circuit diagram of an inverter circuit in a low voltage circuit.

In the low voltage circuit 10, two inverter circuits 11 are connected in cascade. The signal IN_L is input to the preceding inverter circuit 11. An input and an output of the following inverter circuit 11 correspond to the signals OUT_L. As shown in FIG. 2, each of the inverter circuits 11 includes a Pch transistor 111 and an Nch transistor 112, which are connected in series between a low voltage power supply VDDL and a low voltage common node VSSL. These transistors are high threshold voltage transistors free from layout constraints.

Referring back to FIG. 1, a resistive switch circuit 12 is connected between an input and an output of the preceding inverter circuit 11. The switching of the resistive switch circuit 12 is controlled with a control signal CTL, and acts as a resistor when in a conductive state. As shown in the figure, the resistive switch circuit 12 may include a switching element 121 and a resistive element 122 connected in series, a Pch or Nch transistor having channel resistance when turned on, a transfer gate, etc. The transistors forming the resistive switch circuit 12 are also high threshold voltage transistors free from layout constraints.

In the high voltage circuit 20, sources of Nch transistors 21 and 22 are connected to a high voltage common node VSSH. Each of the signals OUT_L is connected to gates of the Nch transistors 21 and 22, respectively. Sources of Pch transistors 23 and 24 are connected to a high voltage power supply VDDH. Drains of the Nch transistors 21 and 22 are connected to drains of the Pch transistors 23 and 24, respectively. Moreover, the drains of the Nch transistors 22 and 21 are connected to gates of the Pch transistors 23 and 24, respectively. The signal OUT_H corresponds to the logical inverse of the voltage at the connecting point between the Pch transistor 24 and the Nch transistor 22.

Operation of the level shifter having the above-described configuration will be described. When the signal IN_L is at an L level, the input and output of the following inverter circuit 11 are at an H level and an L level, respectively, thereby turning on the Nch transistor 21. This turns on the Pch transistor 24 whose gate is supplied with a voltage of the high voltage common node VSSH. The voltage at the connecting point between the Pch transistor 24 and the Nch transistor 22 is the voltage of the high voltage power supply VDDH, i.e., an H level. As a result, the signal OUT_H is determined to an L level, which is the logical inverse of the voltage at the connecting point between the Pch transistor 24 and the Nch transistor 22. On the other hand, when the signal IN_L has the same voltage amplitude as the low voltage power supply, i.e., is at an H level, the inverter circuits and the transistors perform opposite operation, and the signal OUT_H is determined to an H level.

If the logical level of the signal IN_L transitions, the resistive switch circuit 12 shall be set in a conductive state. When in the conductive sate, the resistive switch circuit 12 serves as a resistor, and thus, the portion of the circuit including the preceding inverter circuit 11 and the resistive switch circuit 12 operates as an amplifier. Then, the signal IN_L is amplified to reach the threshold voltage of the following inverter circuit 11 and input to the following inverter circuit 11. Therefore, even if the inverter circuits 11 include high threshold voltage transistors, the level shifter converts the input pulse signal IN_L of low voltage amplitude to high voltage amplitude.

When the resistive switch circuit 12 is in the conductive state, although a through current flows to the preceding inverter circuit 11, as the inverter circuit is driven by a low voltage and includes the high threshold voltage transistors, and thus, the power consumption is lower than that of an inverter circuit including transistors of a low breakdown voltage and a low threshold voltage. By using the high threshold voltage transistors, leakage currents, and aging degradation in the characteristics caused by a kickback from the high voltage power supply can be reduced. When the resistive switch circuit 12 is in the conductive state, a current flows to an input side circuit (not shown) of the signal IN_L from the low voltage power supply or the common node via the resistive switch circuit 12. The resistive switch circuit 12 has a sufficiently great resistance value so that the current can be as small as negligible.

Figure 3:
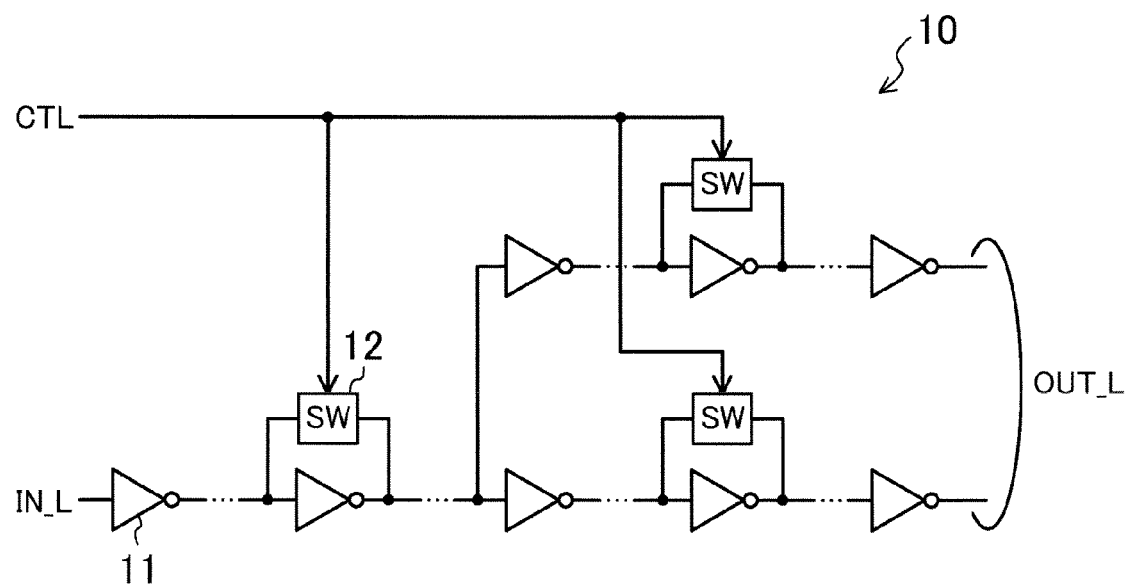
FIG. 3 illustrates a variation of the low voltage circuit.

The number of the inverter circuits 11 forming the low voltage circuit 10 is not limited to two. The number of the resistive switch circuit 12 is not limited to one. For example, the low voltage circuit 10 may be configured as shown in FIG. 3. Specifically, the low voltage circuit 10 may have any configuration, as long as numbers of inverter circuits 11 are connected in cascade and complementary pulse signals OUT_L are output from an input pulse signal IN_L. The resistive switch circuit 12 may have any configuration, as long as it is connected between an input and an output of at least one of the inverter circuits 11. If a plurality of resistive switch circuits 12 exist, they may be similarly controlled with a common control signal CTL, or independently controlled.

Whether or not the resistive switch circuit 12 is in the conductive state, and how many resistive switch circuits 12 are in a conductive state, may be determined depending on the frequency of the signal IN_L, and input impedance of the high voltage circuit 20. Specifically, where the signal IN_L has a high frequency, or the high voltage circuit 20 has high input impedance, a large number of the resistive switch circuits 12 are in a conductive state to increase the amplification properties. On the other hand, where the signal IN_L has a low frequency, or the high voltage circuit 20 has low input impedance, a small number of the resistive switch circuits 12 are turned on, occasionally, all the resistive switch circuits 12 may not be in a conductive state.

Second Embodiment

In the level shifter according to the first embodiment, where the operation of the low voltage circuit 10 is stopped to reduce power consumption etc., the signals OUT_L have high impedance, and the signal OUT_H is inconstant. Thus, another embodiment provides a high voltage circuit which holds signals OUT_H even when the operation of the low voltage circuit 10 is stopped.

Figure 4:
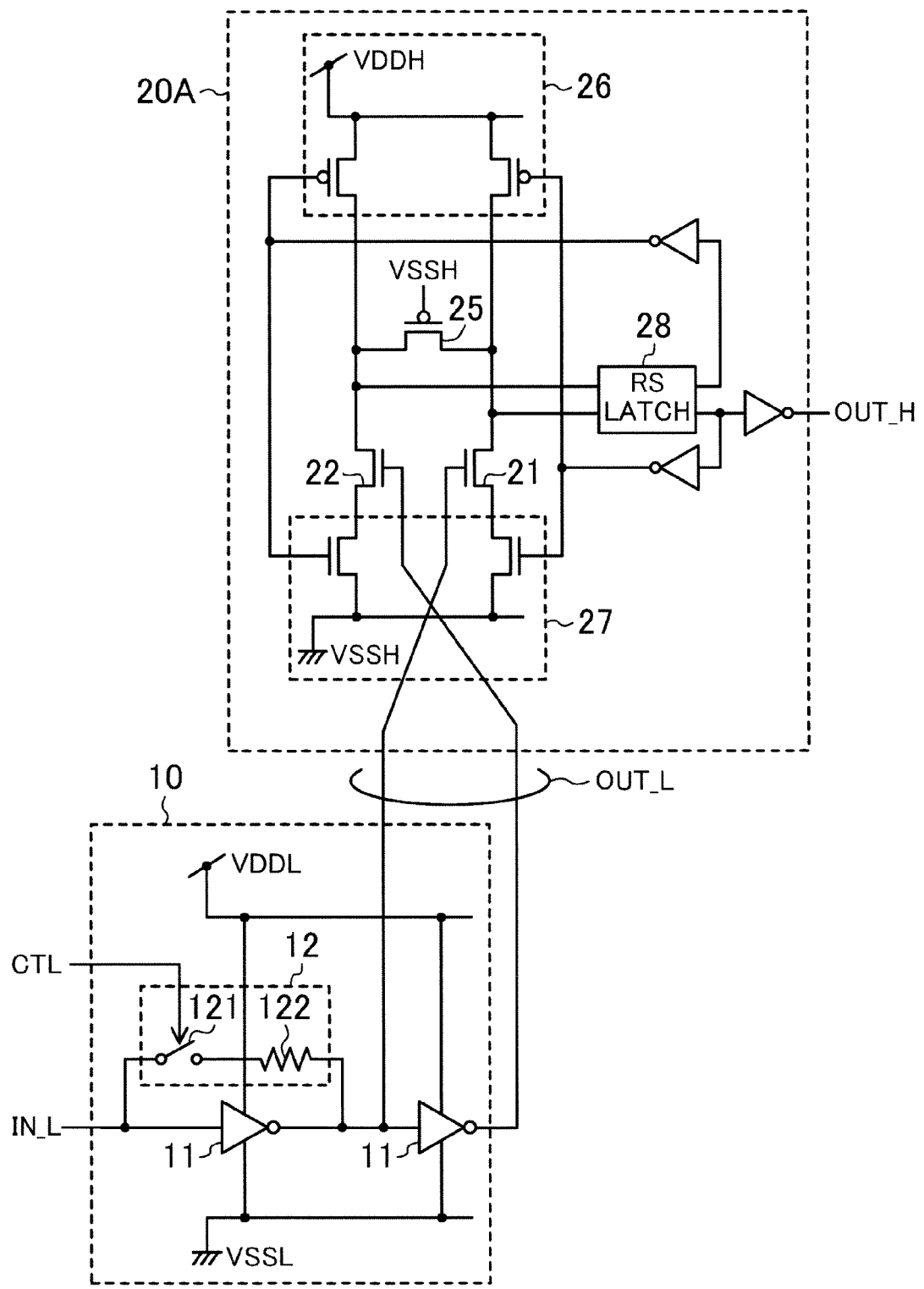
FIG. 4 is a circuit diagram of a level shifter according to a second embodiment.

FIG. 4 illustrates a circuit configuration of a level shifter according to a second embodiment. The level shifter according to this embodiment includes a high voltage circuit 20A different from the high voltage circuit 20 of the first embodiment. The differences from the first embodiment will be described below.

In the high voltage circuit 20A, each of signals OUT_L is connected to gates of Nch transistors 21 and 22, respectively. A resistive element 25 is connected between drains of the Nch transistors 21 and 22. The resistive element 25 may be a Pch transistor whose gate is supplied with the voltage of a high voltage common node VSSH, an Nch transistor whose gate is supplied with the voltage of a high voltage power supply VDDH, a resistive element, etc. The drains of the Nch transistors 21 and 22 are connected to a switch circuit 26. The switch circuit 26 pre-charges drains of the Nch transistors 21 and 22 with the voltage of the high voltage power supply VDDH. The switch circuit 26 may include two Pch transistors connected between the drains of the Nch transistors 21 and 22 and the high voltage power supply VDDH. Sources of the Nch transistors 21 and 22 are connected to a switch circuit 27. The switch circuit 27 blocks through currents and prevent currents from flowing to the common node at the pre-charge of the Nch transistors 21 and 22. The switch circuit 27 may include two Nch transistors connected between the sources of the Nch transistors 21 and 22 and the high voltage common node VSSH.

An RS latch circuit 28 receives drain voltages of the Nch transistors 21 and 22, keeps its output state when both of the drain voltages are at an H level, and changes the output state when one of the drain voltages transitions to an L level. The logical inverse of an output of the RS latch circuit 28 corresponds to the signal OUT_H. The non-inverted output and the inverted output of the RS latch circuit 28 correspond to control signals of the switch circuits 26 and 27. Specifically, the switch circuits 26 and 27 connect the source of one of the Nch transistors 21 and 22 to the high voltage common node and disconnects the drain of the one of the transistors from the high voltage power supply, when connecting the drain of the other Nch transistor to the high voltage power supply and disconnecting the source of the other Nch transistor from the high voltage common node, in accordance with the output of the RS latch circuit 28.

Operation of the high voltage circuit 20A is as follows. Where the low voltage circuit 10 operates, one of the Nch transistors 21 and 22 is turned on in accordance with the transition of the logical level of the signal IN_L, the drain voltage of the Nch transistor temporarily becomes the voltage of the high voltage common node VSSH, i.e., an L level. Therefore, the outputs of the RS latch circuit 28 change, and the logical level of the signal OUT_H transitions. Since the drains of the Nch transistors 21 and 22 are short-circuited via the resistive element 25, the voltage of the turned-on Nch transistor returns to the H level, and the RS latch circuit 28 keeps its output state. Even when the signal OUT_L has high impedance in this state, the output state of the RS latch circuit 28 does not change. Therefore, even when the low voltage circuit 10 stops the operation, the signal OUT_H can be held.

Figure 5:
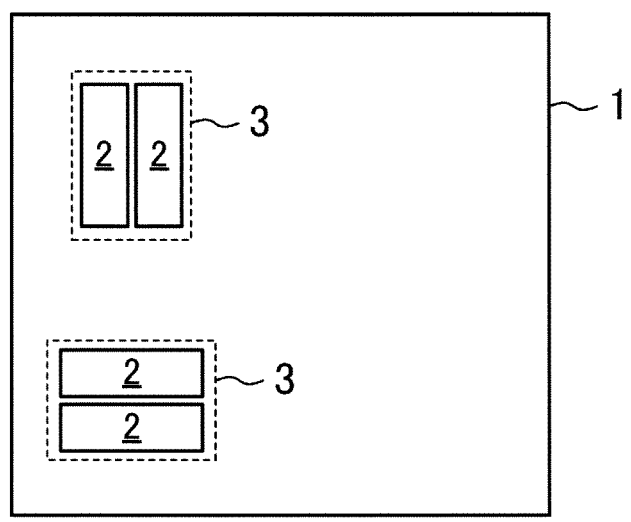
FIG. 5 is an example layout of a level shifter in a semiconductor integrated circuit.

As described above, the level shifters according to the first and second embodiments do not include any low threshold voltage transistor which is under layout constraints, and thus can be freely rotated and positioned in the layout of a semiconductor integrated circuit. FIG. 5 illustrates an example layout of a level shifter in a semiconductor integrated circuit. Level shifters 2 are the level shifters according to the first or second embodiment, and have a rectangular circuit pattern. As a semiconductor integrated circuit 1 is manufactured in a miniaturization process, it shall include vacant regions 3 in various positions. Being free from layout constraints, the level shifters 2 can be rotated and positioned as appropriate in accordance with the vacant regions 3. Therefore, the area of the chip can be efficiently used.

As described above, the first and second embodiments have been described as example techniques disclosed in the present application. However, the techniques according to the present disclosure are not limited to these embodiments, but are also applicable to those where modifications, substitutions, additions, and omissions are made. In addition, elements described in the first to second embodiments may be combined to provide a different embodiment.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above is intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A level shifter for converting an input pulse signal of low voltage amplitude to high voltage amplitude, the level shifter comprising:
    a low voltage circuit configured to generate complementary pulse signals of low voltage amplitude from the input pulse signal; and
    a high voltage circuit configured to generate a pulse signal of high voltage Amplitude based on the complementary pulse signals, wherein:
    the low voltage circuit includes:

a plurality of inverter circuits connected in cascade, each including a high threshold voltage transistor; and a resistive switch circuit connected between an input terminal and an output terminal of one of the plurality of inverter circuits, the output terminal outputting an inverted signal of an input applied to the input terminal, and configured to operate as a resistor when in a conductive state.

2. The level shifter of claim 1, wherein:
a plurality of resistive switch circuits are provided for the plurality of inverter circuits, respectively, and
the plurality of resistive switch circuits are independently controlled.

3. The level shifter of claim 1, wherein
the resistive switch circuit includes a switching element and a resistive element which are connected in series.

4. The level shifter of claim 1, wherein
the resistive switch circuit includes a transistor configured to perform switching with a control signal input to its gate.

5. The level shifter of claim 1, wherein:
the high voltage circuit includes:
  a first Nch transistor and a second Nch transistor whose sources are connected to a high voltage common node, and whose gates are connected to each of the complementary pulse signals, respectively; and
  a first Pch transistor and a second Pch transistor whose sources are connected to a high voltage power supply, whose drains are connected to drains of the first and second Nch transistor, respectively, and whose gates are connected to the drains of the second and first Nch transistors, respectively.

6. The level shifter of claim 1, wherein:
the high voltage circuit includes:
  a first Nch transistor and a second Nch transistor whose gates are connected to each of the complementary pulse signals, respectively;
  a resistive element connected between drains of the first and second Nch transistors;
  a first switch circuit configured to switch between connecting and disconnecting the drains of the first and second Nch transistors to a high voltage power supply;
  a second switch circuit configured to switch between connecting and disconnecting the sources of the first and second Nch transistors to a high voltage common node; and
  an RS latch circuit configured to receive drain voltages of the first and second Nch transistors, and
the first and second switch circuits connect the source of one of the first Nch transistor and the second Nch transistor to the high voltage common node and disconnects the drain of the one of the first Nch transistor and the second Nch transistor from the high voltage power supply, when connecting the drain of the other one of the first Nch transistor and the second Nch transistor to the high voltage power supply and disconnecting the source of the other one of the first Nch transistor and the second Nch transistor from the high voltage common node, in accordance with an output of the RS latch circuit.

7. A semiconductor integrated circuit comprising the level shifter of claim 1.

8. A level shifter for converting an input pulse signal of low voltage amplitude to high voltage amplitude, the level shifter comprising:

a low voltage circuit configured to generate complementary pulse signals of low voltage amplitude from the input pulse signal; and a high voltage circuit configured to generate a pulse signal of high voltage amplitude based on the complementary pulse signals, wherein:

the low voltage circuit includes:
  a plurality of inverter circuits connected in cascade, each including a high threshold voltage transistor; and
  at least one resistive switch circuit connected between an input and an output of at least one of the plurality of inverter circuits, and configured to operate as a resistor when in a conductive state, and the at least one resistive switch circuit includes a switching element and a resistive element which are connected in series.

9. The level shifter of claim 8, wherein
the at least one resistive switch circuit includes two or more resistive switch circuits, each being independently controlled.

10. The level shifter of claim 8, wherein
the at least one resistive switch circuit includes a transistor configured to perform switching with a control signal input to its gate.

11. The level shifter of claim 8, wherein:
the high voltage circuit includes:
  a first Nch transistor and a second Nch transistor whose sources are connected to a high voltage common node, and whose gates are connected to each of the complementary pulse signals, respectively; and
  a first Pch transistor and a second Pch transistor whose sources are connected to a high voltage power supply, whose drains are connected to drains of the first and second Nch transistors, respectively, and whose gates are connected to the drains of the second and first Nch transistors, respectively.

12. A semiconductor integrated circuit comprising the level shifter of claim 8.

13. A level shifter for converting an input pulse signal of low voltage amplitude to high voltage amplitude, the level shifter comprising:

a low voltage circuit configured to generate complementary pulse signals of low voltage amplitude from the input pulse signal; and a high voltage circuit configured to generate a pulse signal of high voltage amplitude based on the complementary pulse signals, wherein:

the low voltage circuit includes:
  a plurality of inverter circuits connected in cascade, each including a high threshold voltage transistor; and
  at least one resistive switch circuit connected between an input and an output of at least one of the plurality of inverter circuits, and configured to operate as a resistor when in a conductive state, the high voltage circuit includes:
  a first Nch transistor and a second Nch transistor whose gates are connected to each of the complementary pulse signals, respectively;
  a resistive element connected between drains of the first and second Nch transistors;
  a first switch circuit configured to switch between connecting and disconnecting the drains of the first and second Nch transistors to a high voltage power supply;

a second switch circuit configured to switch between connecting and disconnecting the sources of the first and second Nch transistors to a high voltage common node; and an RS latch circuit configured to receive drain voltages of the first and second Nch transistors, and the first and second switch circuits connect the source of one of the first Nch transistor and the second Nch transistor to the high voltage common node and disconnects the drain of the one of the first Nch transistor and the second Nch transistor from the high voltage power supply, when connecting the drain of the other one of the first Nch transistor and the second Nch transistor to the high voltage power supply and disconnecting the source of the other one of the first Nch transistor and the second Nch transistor from the high voltage common node, in accordance with an output of the RS latch circuit.

14. The level shifter of claim 13, wherein the at least one resistive switch circuit includes two or more resistive switch circuits, each being independently controlled.

15. The level shifter of claim 13, wherein the at least one resistive switch circuit includes a transistor configured to perform switching with a control signal input to its gate.

16. The level shifter of claim 13, wherein:
the high voltage circuit includes:
a first Nch transistor and a second Nch transistor whose sources are connected to a high voltage common node, and whose gates are connected to each of the complementary pulse signals, respectively; and
a first Pch transistor and a second Pch transistor whose sources are connected to a high voltage power supply, whose drains are connected to drains of the first and second Nch transistors, respectively, and whose gates are connected to the drains of the second and first Nch transistors, respectively.

17. A semiconductor integrated circuit comprising the level shifter of claim 13.

18. The level shifter of claim 1, wherein all transistors included in the plurality of inverter circuits of the low voltage circuit are high threshold voltage transistors.

19. The level shifter of claim 8, wherein all transistors included in the plurality of inverter circuits of the low voltage circuit are high threshold voltage transistors.

20. The level shifter of claim 13, wherein all transistors included in the plurality of inverter circuits of the low voltage circuit are high threshold voltage transistors.

* * * * *